United States Patent [19]

Roeschert et al.

[11] Patent Number: 5,326,826
[45] Date of Patent: Jul. 5, 1994

[54] RADIATION-SENSITIVE POLYMERS CONTAINING DIAZOCARBONYL GROUPS AND A PROCESS FOR THEIR PREPARATION

[75] Inventors: Horst Roeschert, Ober-Hilbersheim, Fed. Rep. of Germany; Hans-Joachim Merrem, Basking Ridge, N.J.; Georg Pawlowski, Wiesbaden; Juergen Fuchs, Floersheim/Wicker, both of Fed. Rep. of Germany; Ralph Dammel, Coventry, R.I.

[73] Assignee: Hoechst Aktiengesellschaft, Frankfurt am Main, Fed. Rep. of Germany

[21] Appl. No.: 841,532

[22] Filed: Feb. 26, 1992

[30] Foreign Application Priority Data

Feb. 28, 1991 [DE] Fed. Rep. of Germany ....... 4106357

[51] Int. Cl.$^5$ .................... C03F 7/023; C08F 30/08
[52] U.S. Cl. ................. 525/326.5; 525/326.8; 525/328.8; 525/386; 526/262; 526/279; 526/309; 526/313; 430/169; 430/170; 430/190; 430/192
[58] Field of Search ............... 430/190, 192, 193, 170, 430/169; 526/313, 262, 279, 309; 534/558, 560, 561; 525/326.5, 326.8, 328.8, 386

[56] References Cited

U.S. PATENT DOCUMENTS

| | | |
|---|---|---|
| 3,779,778 | 12/1973 | Smith et al. |
| 3,837,860 | 9/1974 | Roos |
| 3,902,906 | 9/1975 | Iwama et al. |
| 4,308,368 | 12/1981 | Kubo et al. ............ 525/504 |
| 4,910,123 | 3/1990 | Endo et al. ............ 430/326 |
| 5,087,547 | 2/1992 | Taylor et al. ............ 430/190 |

FOREIGN PATENT DOCUMENTS

| | | |
|---|---|---|
| 242143 | 10/1987 | European Pat. Off. |
| 307828 | 3/1989 | European Pat. Off. |
| 0378067 | 7/1990 | European Pat. Off. |
| 3028308 | 2/1982 | Fed. Rep. of Germany |
| 3930087 | 3/1991 | Fed. Rep. of Germany |
| 1494640 | 12/1977 | United Kingdom |

OTHER PUBLICATIONS

G. Pawlowski et al., "A Novel Two Component Positive Photoresist for Deep UV Lithography", Microelectronic Engineering 11(1990) Apr., Nos. 1/4, Amsterdam, NL.

Patent Abstracts of Japan vol. 5, No. 88 (P-65) Jun. 9, 1981 & JP-A-56 035 129.

Patent Abstracts of Japan vol. 13, No. 347 (P-910)(3695) Aug. 4, 1989 & JP-A-1 106 037.

C. G. Willson, "Organic Resist Materials—Theory and Chemistry", Introduction to Microlithography Theory, Materials and Processing, ACS Symposium Series 219, 87 (1983) pp. 88–159.

H. Sugiyama et al., "Positive Excimer Laser Resists Prepared with Aliphatic Diazoketones", Proc. of the Ellenville Conf., (1988) pp. 51–61.

Y. Tani, et al., "A New Positive Resist for KrF Excimer Laser Lithography", SPIE vol. 1086, Advances in Resist Technology and Processing VI, (1989) pp. 22–32.

G. Schwarzkopf, "New 2-diazocyclohexane-1,3-dione Photoactive Compounds for Deep U.V. Lithography", SPIE Advances in Resist Technology and Processing V, vol. 920, (1988), pp. 51–58.

C. Willson et al., "New Diazoketone Dissolution Inhibitors for Deep U. V. Photolithography", SPIE Advances in Resist Technology and Processing IV, vol. 771, (1987), pp. 2–10.

J. Crivello, "Possibilities for Photoimaging Using Onium Salts", Polymer Engineering and Science, Mid–Dec., vol. 23, No. 17, (1983), pp. 953–956.

F. Houlihan, et al., "An Evaluation of Nitrobenzyl Ester Chemistry for Chemical Amplification Resists", SPIE, Advances in Resist Technology and Processing V, vol. 920 (1988) pp. 67–74.

Primary Examiner—Charles L. Bowers, Jr.
Assistant Examiner—Christopher G. Young
Attorney, Agent, or Firm—Foley & Lardner

[57] ABSTRACT

Radiation-sensitive polymers, a mixture containing these radiation-sensitive polymers as binder, and a process for the preparation of the radiation-sensitive polymer binders are disclosed. A positive radiation-sensitive recording material containing the radiation-sensitive polymer is also disclosed.

46 Claims, No Drawings

RADIATION-SENSITIVE POLYMERS CONTAINING DIAZOCARBONYL GROUPS AND A PROCESS FOR THEIR PREPARATION

BACKGROUND OF THE INVENTION

The present invention relates to radiation-sensitive polymers and to a mixture containing these radiation-sensitive polymers as a binder. The invention also relates to a process for the preparation of the radiation-sensitive polymer binder and to a positive, radiation-sensitive recording material prepared using the radiation-sensitive mixture. The recording material is particularly suitable for the production of photoresists, electronic components and printing plates and for chemical milling.

Positive, radiation-sensitive mixtures have been known for a long time. The use of these mixtures in radiation-sensitive copying materials, such as blueprinting papers, planographic printing plates, colorproof sheets and dry and liquid resists and for chemical milling has frequently been described.

The continuing miniaturization of structures, for example, in chip production, down to the range of less than 1 μm, demands modified lithographic techniques. In order to obtain an image of such fine structures, short wavelength radiation is used, such as high-energy UV light, electron beams and X-rays. The radiation-sensitive mixture must be suited to the shortwave radiation. The demands which must be met by the radiation-sensitive mixture are listed in the article by C. G. Willson "Organic Resist Materials Theory and Chemistry" (Introduction to Microlithography, Theory, Materials, and Processing, edited by L. F. Thompson, C. G. Willson, M. J. Bowden, ACS Symp. Ser. 219: 87 (1983), American Chemical Society, Washington). There is therefore an increased demand for radiation-sensitive mixtures which can be used in the more recent technologies, such as mid-UV or deep-UV lithography, with illumination, for example, by means of Excimer lasers at wavelengths of 305 nm (XeF), 248 nm (KrF) and 193 nm (ArF), electron radiation lithography and X-ray lithography. The mixtures are preferably also sensitive in a broad spectral range and can thus be used in conventional UV lithography.

Two routes have been taken in order to improve the resolution of photoresists. On the one hand, an attempt was made to develop resists based on conventional novolaks/α-diazocarbonyl compounds for the deep-UV range, which resists have a further reduced solubility in the non-irradiated regions. On the other hand, photoresist systems were developed which are based on the principle of "chemical amplification."

In the presence of e-diazocarbonyl compounds, the solubility of novolaks in alkali is greatly reduced, i.e., the α-diazocarbonyl compounds act as solubility inhibitors. In addition to the diazonaphthoquinone sulfonic acid esters, 2-diazo-1,3-dicarbonyl compounds, such as 5-diazo-Meldrum's acid, derivatives of 2-diazocyclohexane-1,3-dione and 2-diazocyclopentane-1,3-dione and aliphatic 2-diazo-1,3-dicarbonyl compounds are to be singled out. α-Phosphoryl-substituted diazocarbonyl compounds and polyfunctional α-diazo-β-ketoesters are also described as photoactive inhibitors in positive resists, especially those which are radiation-sensitive in the deep-UV range (DUV).

In their article "Positive Excimer Laser Resists Prepared with Aliphatic Diazoketones" (Proc. of the Ellenville Conf. 51 (1988)), H. Sugiyama et al. also propose α-diazoacetoacetates. Diazocarbonylsulfonyl chlorides are described by Y. Tani et al. [SPIE Proc., Adv. in Resist Techn. and Proc. 1086: 22 (1989)]. Further diazocarbonyl and diazo-1,3-dicarbonyl compounds are given in G. Schwarzkopf [SPIE Proc., Adv. in Resist Techn. and Proc. 920: 51 (1988)]. are given in G. Schwarzkopf (SPIE Proc., Adv. in Resist Techn. and Proc. 920: 51 (1988)).

Upon irradiation, all of these compounds rearrange to form ketene derivatives. These ketene derivatives then react further with residual moisture, which is frequently already present in the resist, to form carboxylic acids. The carboxylic acids, in turn, increase the solubility of the novolaks in aqueous-alkaline developers. However, it has been found that some of the photoactive diazocarbonyl compounds bleed from the resist layer under the relatively high processing temperatures frequently used in practice and the radiation-sensitive mixture thus loses its original activity, so that reproducible results are no longer possible.

It is true that photoactive components are known which have a lower volatility, but these, depending on their structure, show a poorer compatibility in the radiation-sensitive mixture. Especially when drying the radiation-sensitive layers, this has a noticeable adverse effect due to crystallization of the photoactive compound. In addition, these components are frequently sparingly soluble in the conventional solvents. Some of the diazocarbonyl compounds described additionally have the disadvantage that the carbenes formed therefrom upon irradiation do not have a stability in the matrix which is adequate for the desired carboxylic acid formation. This leads to an inadequate difference in solubility between the exposed and unexposed regions during development and thus to an undesirably high degree of stripping in the unexposed regions. An explanation for this phenomenon is proposed by C. G. Willson et al. in SPIE Proc., Adv. in Resist Techn. and Proc. 771: 2 (1987).

α-Phosphoryl-substituted diazo compounds are not used for resists in practice, since atoms which can be used as doping agents, such as the phosphorus contained in these compounds, have to be strictly excluded in the subsequent processing steps. It is true that derivatives of to image differentiation are poor. Radiation-sensitive recording materials containing the diazocarbonyl compounds described generally have an inadequate photosensitivity, even in combination with highly transparent binders.

Mixtures containing a binder which is insoluble in water and soluble or at least swellable in aqueous-alkaline solutions, a component which forms a strong acid under the action of actinic radiation, and a compound which can be split by acid containing, for example, a C—O—C or C—O—Si bond, are known in principle. See, e.g., DE 23 06 248 (=U.S. Pat. No. 3,779,778).

The compounds forming a strong acid on irradiation which have been used are, in particular, onium salts, such as diazonium, phosphonium, sulfonium and iodonium salts of non-nucleophilic acids, such as $HSbF_6$, $HAsF_6$ or $HPF_6$ (J. V. Crivello, Polym. Eng. Sci. 23: 953 (1983)). In addition, halogen compounds, particularly trichloromethyltriazine derivatives or trichloromethyloxadiazole derivatives, o-quinonediazidesulfonyl chlorides, o-quinonediazide-4-sulfonic acid esters, organometallic/organohalogen combinations, bis(sulfonyl)diazomethanes, sulfonylcarbonyldiazomethanes (DE 39 30 087) and nitrobenzyltosylates (F. M. Houlihan et al., SPIE Proc., Adv. in Resist Techn. and Proc. 920:67 (1988)) have been recommended.

The strong acid formed upon irradiation of the materials described above splits the C—O—C or C—O—Si bonds of the acid-labile compounds. As a result, the exposed regions of the photosensitive layers become more soluble in an aqueous-alkaline developer. If shortwave radiation is used for irradiation, this demands new binders which are highly transparent at these wavelengths. However, radiation-sensitive layers composed of mixtures comprising such a highly transparent, radiation-insensitive binder, an acid-labile compound having at least one C—O—C or C—O—Si bond which can be split by acid, and a compound which forms a strong acid on irradiation have a solubility in the developer in the non-irradiated regions that is too high. This is reflected in an unacceptable dark-erosion. The consequence of this is an inadequate edge profile and a reduced resolution. Overall, the systems described above based on the principle of "chemical amplification" do have an exceptionally high photosensitivity (50 mJ/cm$^2$ and less), but an unsatisfactory resolution for structures in the range of less than 0.5 μm.

Radiation-sensitive mixtures, which contain radiation-sensitive polymers, have already been described for a number of applications. Condensation products of novolak resins with orthoquinonediazide compounds (see, e.g., DE 30 09 873=U.S. Pat. No. 4,308,368, DE 30 28 308, EP 242,143) are particularly important. However, as a result of the novolak constituent, these radiation-sensitive polymers have absorption characteristics which make them unsuitable for exposure in the DUV range.

More transparent, radiation-sensitive polymers can be prepared by a condensation reaction of hydroxyl group-containing polymers, such as poly(4-hydroxystyrene) or copolymers of pyrogallol with ketones, and polyacrylates with 2,1-diazonaphthoquinone-5- and/or -4-sulfonic acid chlorides. The hydroxyl group-containing polymers have, however, an extremely high solubility in standard developers, which is reduced only after the predominant proportion of the free hydroxyl groups has reacted. This results in a high proportion of diazonaphthoquinone units. This leads to unacceptable optical characteristics especially at 248 nm. Examples of mixtures containing such polymers are given in DE 20 28 903 (=U.S. Pat. No. 3,837,860), DE 23 52 139, DE 24 61 912 (=GB 1,494,640) and EP 307,828.

Radiation-sensitive polymers having a diazocarbonyl group as a photosensitive component are given in JP 01-106,037. The radiation-sensitive unit is bonded to the alkyl chain of a 4-alkyl-substituted polystyrene. The polymers are characterized by low thermal stability and an inadequate sensitivity to radiation. 2-Diazo-1,3-dicarbonyl units, bonded to conventional novolak resins, have, as already discussed in detail above, a low transparency in the range of shortwave radiation and unsatisfactory bleed characteristics. Radiation-sensitive recording materials containing polymers having 2-diazo-1,3-dicarbonyl groups as a radiation-sensitive structural element, in particular those containing maleimide/olefin copolymers, are disclosed in U.S. Pat. No. 4,910,123. The resist materials prepared with these polymers have, however, a radiation sensitivity of only about 50 mJ/cm$^2$.

SUMMARY OF THE INVENTION

It is therefore an object of the present invention to provide a radiation-sensitive mixture having high photosensitivity in the DUV region.

It is a further object of the invention to provide a mixture which does not have the disadvantages described above for the numerous known mixtures.

It is yet another object of the invention to provide a radiation-sensitive layer displaying a good differentiation between the exposed and unexposed regions of the layer.

It is another object of the invention to provide a radiation-sensitive mixture that is readily compatible under the diverse process conditions used in practice and that has a high thermal stability, so that resolution in the sub-half-micrometer range is possible with an acceptable resist profile.

These and other objects according to the invention are provided by a radiation-sensitive polymer which is insoluble in water and soluble or at least swellable in aqueous-alkaline solutions. The polymer comprises:

(a) units having side groups of the formula I

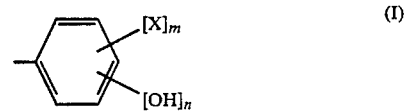

and (b) units having radiation-sensitive side groups of the general formula II

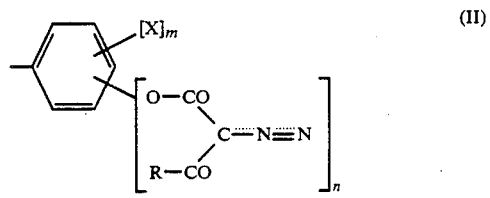

wherein the numerical ratio of units (a) to units (b) is about 98:2 to 0:100, where R is an acyclic, isocyclic or heterocyclic radical having 3 to 20 carbon atoms, X is a (C$_1$-C$_6$)alkyl, (C$_1$-C$_6$)alkoxy-(C$_1$-C$_6$)alkyl, carboxyl, formyl, (C$_1$-C$_{15}$)alkoxycarbonyl, (C$_2$-C$_5$)alkanoyl or (C$_1$-C$_6$)alkoxy group or a halogen atom, m is 0, 1 or 2, it being possible for the radicals X to differ if m=2, and n is 1 or 2, it being possible for the radicals R to differ if n=2.

Also provided according to the present invention is a positive, radiation-sensitive mixture, comprising (a) a compound containing at least one C—O—C or C—O—Si bond which can be split by acid, (b) a compound which forms a strong acid on irradiation, and (c) a binder which is insoluble in water and soluble or at least swellable in aqueous-alkaline solutions, comprising a radiation-sensitive polymer according to the invention. A process for the preparation of radiation-sensitive polymers according to the invention is also provided, comprising the steps of at least partly esterifying a polymer that contains phenolic hydroxyl groups and that is not radiation-sensitive with a compound comprising —CO—CH$_2$—CO—R groups, and then treating the resultant product with a diazo transfer reagent.

A positive, radiation-sensitive recording material according to the present invention comprises a support material, and a radiation-sensitive layer comprising a radiation-sensitive polymer or mixture according to the invention coated on the support material.

A method of producing an image according to the invention comprises the steps of imagewise irradiating a positive, radiation-sensitive recording material according to the invention with radiation having a wavelength of about 190 to 400 nm, and developing the recording material to produce a positive image.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

A radiation-sensitive polymer according to the present invention comprises (a) units having side groups of the general formula I

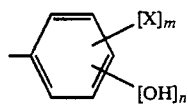

and, derived therefrom, (b) units having radiation-sensitive side groups of the general formula II

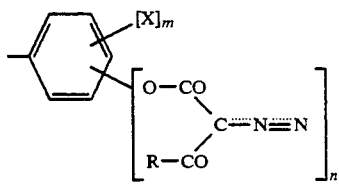

wherein a numerical ratio of units (a) to units (b) is about 98:2 to 0:100, and where R is an acyclic, isocyclic or heterocyclic radical having 3 to 20 carbon atoms, X is a (C$_1$-C$_6$)alkyl, (C$_1$-C$_6$)alkoxy-(C$_1$-C$_6$)alkyl, carboxyl, formyl, (C$_1$-C$_{15}$)alkoxycarbonyl, (C$_2$-C$_5$)alkanoyl or (C$_1$-C$_6$)alkoxy or a halogen atom, m is 0, 1 or 2, it being possible for the radicals X to differ if m=2, and n is 1 or 2, it being possible for the radicals R to differ if n=2.

In addition to the units containing a group of the general formula I or II, the radiation-sensitive polymers can also contain other units. The solubility and the transparency (in the desired wavelength range) can be adjusted in a desired manner by the incorporation of such additional units in the radiation-sensitive polymer. The radical R can optionally be substituted, in particular by (C$_1$-C$_3$)alkyl, (C$_1$-C$_3$)alkoxy, halogen, amino or nitro. If the radical R is substituted, the substitution is preferably by (C$_1$-C$_3$)alkyl or (C$_1$-C$_3$)alkoxy. However, if R is an alkyl radical, the latter is preferably unsubstituted.

Particularly suitable radicals R are acyclic, C-containing radicals, especially alkyl radicals. These can be straight-chain or branched and contain preferably 3 to 10 and in particular 4 to 8 chain members. Pure carbon chains are particularly preferred, but alkyl radicals in which CH$_2$ groups have been replaced by oxygen atoms or —NH— and/or carbonyl groups are also suitable. The alkyl radicals R can thus contain —CO—O—, —CO—NH— and/or —O—CO—NH— groups. In addition, —CH— groups can be replaced by —N—. Preferred alkyl radicals R in which —CH$_2$— groups have been replaced by —O— bridges are those which contain two of these —O— bridges. If the chains are pure, in particular straight-chain, carbon chains, it is not essential to restrict the number of carbons; alkyl radicals containing up to 20 carbon atoms are suitable. However, the tert-butyl radical is particularly preferred.

If R is a cycloalkyl radical, which is to be understood as including bicycloalkyl and polycycloalkyl radicals, the number of ring carbons is preferably 4, 5, 6 or 10, particularly preferably 4, 5 or 6. The unsubstituted representatives are particularly preferred. Examples which may be mentioned are the cyclobutyl radical, the cyclopentyl radical and the cyclohexyl radical. However, the cyclohexyl radical is particularly preferred.

The radical R can also be an aralkyl radical or, in the broader sense, a radical to which the aromatic part is bonded via a non-aromatic, C-containing bridge member. If R is an aralkyl radical, the number of members in the aliphatic part is preferably 1 to 11, particularly preferably 2 to 5. Of the purely aliphatic bridge members, methylene or ethane-1,2-diyl is preferred. If a CH$_2$ group in the ethane-1,2-diyl bridge is replaced by an oxygen atom, this preferably forms the bridge between the aromatic and the aliphatic part of the radical R. In a three-membered bridge containing two carbon chain members and one oxygen chain member, the oxygen is preferably arranged between the two CH$_2$ groups. Radicals to be mentioned in particular are the benzyl radical and the phenethyl radical for the first case, the phenoxymethyl radical for the second case and the benzyloxymethyl radical for the third case. In this context, however, those radicals in which CH$_2$ groups in the aliphatic part have been replaced not only by —O— but also by —NH and/or —CO—, and in which —CH— has been replaced by —N—, should also be regarded as aralkyl radicals. Examples of such radicals are phenoxycarbonyl and benzyloxycarbonyl radicals, and also benzyloxy-carbonylamino and phenoxycarbonylamino radicals. The radical R can, however, also be a phthalimido group. The general criterion is that the bridge member contain at least one carbon atom in the chain in addition to any heteroatoms which may be present. The aromatic part of the araliphatic radical preferably consists of 6 to 10, and particularly preferably of 6, carbon atoms. If this part is directly adjacent to a carbonyl group, i.e., an aroyl radical is present, the aliphatic part can contain an arbitrary number of carbon atoms.

The aromatic radicals R are preferably isocyclic, i.e., they do not contain any heteroatoms, such as, for example, oxygen, in their ring system. The aromatic radical contains in particular 6 to 10 carbon atoms, preferably 6 carbon atoms, i.e., it is a phenyl radical. However, aromatic radicals R are not preferred.

Of all of the above-mentioned radicals R, tert-butyl, n-hexyl, nonyl, octadecyl, 2,5-dioxahexyl, cyclopentyl, cyclohexyl, benzyl, phenethyl, phenoxymethyl and benzyloxymethyl are preferred. The tert-butyl radical, the phenethyl radical, the phenoxymethyl radical and the cyclohexyl radical are particularly preferred.

The radiation-sensitive polymer on which the radiation-sensitive polymer binder is based contains groups of the general formula I. Suitable polymers containing such mono- or dihydroxyphenyl groups are, for example, transparent novolaks and homopolymers from the class comprising poly(hydroxy)styrenes, monosubstituted (m=1) and disubstituted (m=2) poly(hydroxy)styrenes, substituted and unsubstituted poly($\alpha$-methylhydroxystyrenes) and monoesters of acrylic acid and methacrylic acid with aromatic compounds containing substituted or unsubstituted phenolic groups (for example, di- or trihydroxybenzenes and their derivatives). However, copolymers and terpolymers of monomers containing groups of the general formula I can also be used. Finally, copolymers and terpolymers of such monomers and others which contain no optionally substituted (di)hydroxyphenyl groups are also suitable. Suitable comonomers and termonomers are, for example, styrene, maleimide, N-substituted maleimides, vinyl alkyl ethers and vinyltrialkylsilanes. The proportion of such "other" monomers in the polymer can differ substantially. Thus, the proportion of styrene in a styrene/hydroxystyrene copolymer can be, for example, up to about 85% by weight. Homopolymers, copolymers and terpolymers are always preferred to mixtures (blends).

The radiation-sensitive binders according to the invention prepared from these polymers are distinguished in particular by the fact that they readily dissolve the other constituents of the radiation-sensitive mixture according to the invention and have a low inherent absorption, i.e., a high transparency, particularly in the wavelength range from about 190 to 300 nm, and bleach severely on exposure to actinic radiation. These conditions are not met by known binders based on conventional novolaks.

However, novolaks can also be used in the mixtures according to the invention if they are mixed with other binders of higher transparency, which are described in more detail below. The mixing ratio depends on the structure of the highly transparent binder, which determines not only the degree of inherent absorption in the specified wavelength range, but also the miscibility with the other constituents of the radiation-sensitive mixture. The binder mixture can generally contain up to about 40% by weight, preferably up to about 25% by weight, of a novolak. Upon irradiation with light having a wavelength of 248 nm, suitable novolaks or novolak mixtures, in a layer about 1.0 $\mu$m thick, have an absorption of less than about 0.5; their average molecular weight is between about 500 and 30,000.

Among the unsubstituted poly(hydroxy)styrenes (PHS), the copolymers of 4-hydroxystyrene are preferred and among the substituted PHS the homopolymers and copolymers of 3-alkyl- and 3,5-dialky-4-hydroxystyrene are preferred. The average molecular weight is between about 3,000 and 300,000, but preferably between about 5,000 and 100,000, particularly preferably between about 10,000 and 35,000.

In the case of the monosubstituted poly(4-hydroxy)styrenes, the substituents X are preferably ($C_1$-$C_5$)alkyl and ($C_1$-$C_5$)alkoxy groups. Particularly suitable alkyl groups are methyl, ethyl and n-propyl groups. Radicals X having a lower number of carbon atoms are preferred. The methyl group is particularly preferred. The number m of substituents X is 0, 1 or 2, preferably 1. If m is 2, X is preferably methyl.

In the case of poly($\alpha$-methyl-4-hydroxy)styrenes, the same applies as in the case of the polymers without an $\alpha$-methyl group. However, these are not preferred.

Suitable monomers which may be mentioned for the preparation of poly(methacrylic acid) mono- and dihydroxyphenyl esters are the monomethacrylates of di- and trihydroxybenzenes, in particular of pyrocatechol, resorcinol, hydroquinone, pyrogallol, phloroglucinol and hydroxyhydroquinone and the monomethacrylates of various substituted trihydroxybenzaldehydes and trihydroxybenzoic acid esters. Particularly suitable substituents X are ($C_1$-$C_6$)alkyl, ($C_1$-$C_6$)alkoxy, formyl and ($C_1$-$C_{15}$)alkoxycarbonyl groups. Examples which may be mentioned are gallaldehyde (X=CHO), various gallic acid esters [X=COOR'; R'=($C_1$-$C_{15}$)alkyl] and also the monoesters of trihydroxybenzenes with other substitution patterns. All of these monomers can optionally be further substituted. With regard to the substituents on the aromatic ring and also with regard to the alcohol component OR' of the gallic acid esters there are no restrictions other than that, under the reaction conditions, the functional group must not react in an undesired manner, in particular there must be no transesterification or ester splitting. Trihydroxy-substituted benzaldehydes and alkyl gallates are therefore particularly preferred. Particularly preferred alkyl radicals are methyl, propyl, octyl and dodecyl radicals. In these cases m is preferably 1. The average molecular weight of these polymers is between about 1,000 and 100,000, preferably between about 2,000 and 50,000 and particularly preferably between about 3,000 and 30,000.

Preferred monomers for poly(methacrylic acid esters) are the monomethacrylates of pyrocatechol, hydroquinone, phloroglucinol and hydroxyhydroquinone. The 2-, 3- and 4-hydroxyphenyl esters and the 3,5-dihydroxyphenyl esters of methacrylic acid are particularly preferred.

The structure of some of the polymer units having side groups of the general formula I which preferably occur in the polymers according to the invention is indicated below:

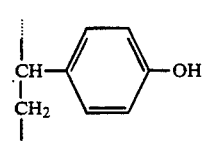

Ia

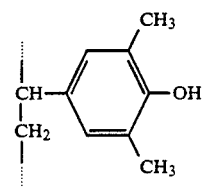

Ib

-continued

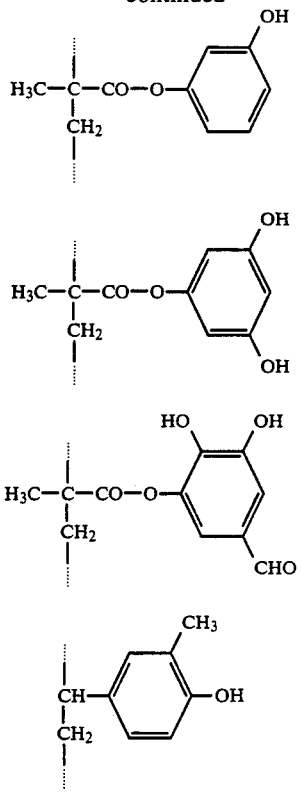

Ic

Id

Ie

If

Suitable copolymers and terpolymers containing groups of the general formula I contain, for example, units of 4-hydroxystyrene and/or one or two of the following monomers: 3,5-dialkyl-4-hydroxysytrene, 3-alkyl-4-hydroxystyrene, 3-hydroxystyrene, vinyl ($C_1$-$C_{25}$) alkyl ethers, styrene, methyl methacrylate and methyl acrylate. Particularly preferred vinyl alkyl ethers are those having a medium-length chain or longer-length chain alkyl radical, such as n-hexyl, n-octyl, n-dodecyl and n-octadecyl. The average molecular weight of the various copolymers and terpolymers is between about 3,000 and 300,000, preferably between about 5,000 and 100,000 and particularly preferably between about 5,000 and 35,000.

Mixtures having increased stability towards oxygen plasma are obtained if silicon-containing vinyl monomers, for example, vinyltrimethylsilane, are used to prepare the copolymers or terpolymers. The transparency of these binders is generally even higher in the DUV range, so that an improved imaging is possible.

Copolymers of the various hydroxystyrenes with N-substituted maleimides can also be used with equal success. The substituents on the nitrogen atom of the maleimide are aliphatic, cycloaliphatic, araliphatic and also aromatic radicals. These may be either substituted or unsubstituted. Particularly preferred N-substituents are the phenyl radical and the cycloalkyl radical.

Poly(methacrylic acid monoesters) are preferably used as homopolymers or as copolymers or terpolymers with maleimide and/or styrene. In principle, virtually all polymers can be used which contain phenolic hydroxyl groups and no further groups reacting with carboxylic acid esters, or which, under the reaction conditions described, react with clear ester formation.

Overall, the following may be mentioned as particularly preferred binders containing groups of the general formula I: poly (3-methyl-4-hydroxy) styrene, copolymers of 3-methyl-4-hydroxystyrene and 4-hydroxystyrene, copolymers of 3,5-dimethyl-4-hydroxystyrene and 4-hydroxystyrene, and also copolymers of 4-hydroxystyrene and styrene. Mixtures (blends) of these and other polymers are also suitable.

The amount of binder in the radiation-sensitive mixture is generally about 40 to 100% by weight, in particular about 50 to 95% by weight and preferably about 60 to 90% by weight, based on the total weight of solid contained therein. It is clear from this that in the extreme case a radiation-sensitive polymer on its own, without the addition of an acid-cleavable compound containing a C—O—C or C—O—Si bond and a compound forming a strong acid on irradiation, is also suitable. However, such an embodiment is not preferred.

The ratio of the polymer units containing groups of the general formula I to those containing groups of the general formula II varies between about 98:2 and 0:100, preferably between about 95:5 and 40:60 and particularly preferably between about 90:10 and 50:50. The optimum ratio is dependent primarily on the structure of the binder and thus on the solubility of the resulting formulation and on the transparency of the layer in the DUV region, especially at a wavelength of 248 nm.

The following classes of compound in particular have proved suitable as acid-cleavable materials in the radiation-sensitive mixture according to the invention:

(a) those containing at least one orthocarboxlic acid ester and/or carboxylic acid amidoacetal group, the compounds also having a polymer character and it being possible for the said groups to occur in the main chain or a side chain, (b) oligomer or polymer compounds containing recurring acetal and/or ketal groups in the main chain, (c) compounds containing at least one enol ether or N-acryliminocarbonate group, (d) cyclic acetals or ketals of β-ketoesters or β-ketoamides, (e) compounds containing silyl ether groups, (f) compounds containing silyl enol ether groups, (g) monoacetals or monoketals of aldehydes or ketones, the solubility of which in the developer is between 0.1 and 100 g/l, (h) ethers based on tertiary alcohols, and (i) carboxylic acid esters and carbonates, the alcohol component of which is a tertiary alcohol, an allyl alcohol or a benzyl alcohol.

Acid-cleavable compounds have already been described briefly further above. Thus, acid-cleavable compounds of type (a) as components of radiation-sensitive mixtures are described in detail in DE 26 10 842 and DE 29 28 636. Mixtures containing compounds of type (b) are described in DE 23 06 248 and DE 27 18 254. Compounds of type (c) are described in EP 6,626 and EP 6,627. Compounds of type (d) are proposed in EP 202,196 and compounds which are to be regarded as being of type (e) are proposed in DE 35 44 165 and DE 36 01 264. Compounds of type (f) are found in DE 37 30 785 and DE 37 30 783, while compounds of the (g) are discussed in DE 37 30 787. Compounds of type (h) are described, for example, in U.S. Pat. No. 4,603,101 and compounds of type (i), for example, in U.S. Pat. No. 4,491,628 and by J. M. Fréchet et al., J. Imaging Sci. 30: 59–64 (1986).

Mixtures of the above-mentioned acid-cleavable materials can also be employed. However, use of an acid-cleavable material which belongs to only one of the above-mentioned categories is preferred, especially a material having at least one C—O—C bond splittable by acid, i.e., those materials which belong to the types (a), (b), (g) and (i) are particularly preferred. Under type (b) the polymeric acetals are preferred; among the acid-cleavable materials of type (g) those compounds are preferred that are derived from aldehydes or ketones having a boiling point above about 150° C., preferably above about 200° C.

The content of acid-cleavable material in the radiation-sensitive mixture according to the invention should be about 1 to 50% by weight, preferably about 10 to 40% by weight, in each case based on the total weight of the layer.

Compounds suitable for the mixture according to the invention which liberate a strong acid under the action of actinic radiation have already been described in detail above. The use of specific photolytic acid-forming agents, such as onium salts, halogen compounds and nitrobenzyltosylates is, however, associated with certain disadvantages which drastically limit the possibilities for use of the substances in various fields of application. These disadvantages are described in detail in DE 39 30 086.

Preferred photolytic acid-forming agents are, therefore, compounds that form strong acids and that do not have a corrosive action, e.g., sulfonic acids. Preferred acid-forming agents of this type are, for example, bis(sulfonyl)diazomethanes (DE 39 30 086), sulfonylcarbonyldiazomethanes (DE 39 30 087) and o-diazonaphthoquinone-4-sulfonates. Bis(sulfonyl)diazomethanes are particularly preferred.

The content of photoactive acid-forming agents in the mixture according to the invention is generally between about 0.5 and 25% by weight, preferably between about 1 and 10% by weight and particularly preferably between about 2 and 7% by weight, in each case based on the total weight of the layer.

Upon exposure of the mixture according to the invention to actinic radiation a strong acid is formed by photolysis of the photoactive acid-forming agent, which acid splits the C—O—C or C—O—Si bonds in the acid-labile compounds. As a result, the exposed regions of the photosensitive layers become soluble in an aqueous-alkaline developer. This effect is intensified by the conversion of the diazoketo function in the side chain of the radiation-sensitive polymer units of the binder into a carboxylic acid function.

The radiation-sensitive mixture according to the invention is distinguished by a good differentiation between exposed and unexposed regions of the layer and by a high photosensitivity over a broad spectral range. It has a high thermal stability and provides detail-accurate reproduction even of extremely fine structures in an original. Preferably, no corrosive photolysis products are liberated as a result of the exposure, so that the mixture can also be used on sensitive substrates.

The radiation-sensitive binders according to the invention which contain groups of the general formula II and have been characterized in more detail above are outstandingly suitable as radiation-sensitive polymers in a radiation-sensitive mixture for the production of high-resolution photoresists for microlithography. The compounds according to the invention are particularly suitable for exposure to actinic radiation. In this context, actinic radiation should be understood to be any radiation whose energy corresponds at least to that of short-wave visible light. UV radiation is suitable, in the range from about 190 to 450 nm, preferably from about 200 to 400 nm and particularly preferably from 200 to 300 nm. Electron radiation and X-rays are also suitable.

The present invention also relates to a process for the preparation of the polymers according to the invention containing side groups of the general formula II. In this process it has proved particularly advantageous first to prepare suitable precursors, which contain groups of the general formula III, and then to convert these groups into the groups of the formula II in a subsequent reaction by means of a so-called diazo transfer (cf. M. Regitz et al., Org. Prep. Proceed. 99 (1969)).

To this end, a polymer containing groups of the general formula III (in which R has the meaning indicated in formula II)

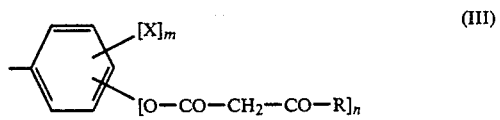

is dissolved in a 5-fold to 50-fold, preferably 10-fold to 20-fold, amount (based on the weight) of a suitable solvent and the solution is cooled to a temperature between −15° C. and +15° C., preferably −5° C. and +5° C. Suitable solvents are alcohols, such as methanol and ethanol, hydroxyethers, such as ethylene glycol monomethyl ether, chlorinated hydrocarbons, such as dichloromethane and trichloromethane, aliphatic nitriles, such as acetonitrile, or mixtures of these solvents. Preferred solvents are those which have a boiling point between about 30° C. and 140° C. The reaction with the diazo transfer reagent is appropriately carried out according to one of three variants. These variants are, inter alia, described in detail in EP 378,068, and for this reason are not described here. Diazo transfer reagents which have proved particularly suitable are aromatic and aliphatic sulfonyl azides, such as p-toluenesulfonyl azide, 4-carboxybenzenesulfonyl azide, 2-naphthalenesulfonyl azide or methane sulfonyl azide. The radiation-sensitive polymers prepared in this way can be purified by known methods, for example, by means of crystallization or chromatography (preparative GPC).

The preparation of the polymers containing side-chain β-ketoester groups, which serve as precursor, can, in turn, be carried out by various procedures which are known in principle from the literature. A particularly elegant procedure is the reaction of 5-acyl-2,2-dimethyl-[1,3]dioxane-4,6-dione (5-acyl-Meldrum's acid of formula IV in which the radical R has the same meaning as in formula II)

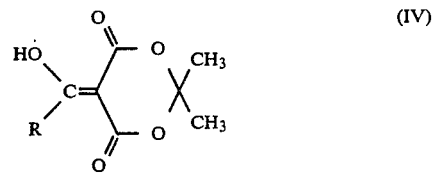

with the polymer binder which contains groups of the general formula I. The preparation of 5-acyl-Meldrum's acids and their reaction with carbinols to form β-ketoesters is known. The preparation can, for example, be carried out analogously to the methods of Y. Oikawa et al., J. Org. Chem. 43:2087 (1987) by reaction of acid chlorides with Meldrum's acid, or analogously to the method of P. Houghton and D. J. Lapham, Synthesis 451 (1982).

The reaction is obtained by adding the amount of 5-acyl-Meldrum's acid required to obtain the desired degree of conversion to the polymer binder which contains phenolic hydroxyl groups and then dissolving the mixture in the 5-fold to 20-fold, preferably approximately 10-fold, amount of a solvent which does not react with alcohols or with the 5-acyl-Meldrum's acid. For example, a ketone, such as acetone or ethyl methyl ketone, or an ether, such as 1,2-dimethoxyethane or dioxane, can be used, if appropriate with heating. The clear solution is then heated to a temperature of 60° C. to 120° C., preferably 80° C. to 100° C. The start of the reaction is discernable by vigorous evolution of carbon dioxide. The mixture is stirred at the above-mentioned temperature for about 1 to 6 hours, preferably about 2 to 4 hours, until no further evolution of $CO_2$ can be observed.

The solvent is then stripped off under vacuum, the reaction mixture as a rule foaming vigorously. The product is obtained in high purity, so that as a rule it is possible to dispense with a further purification in accordance with the known methods.

The preparation of the polymers containing side-chain β-ketoester groups used as precursor can also be carried out by reaction of polymers which contain groups of the general formula I with β-ketoesters of the general formula V

$$R-CO-CH_2-CO-OR''\qquad(V)$$

in which R'' is in particular methyl or ethyl. The transesterification reaction for the preparation of monofunctional β-ketoesters has been described, for example, by A. R. Bader et al. in J. Amer. Chem. Soc. 73:4195 (1951).

If the polymers containing side-chain β-ketoester groups are to be prepared by transesterification of compounds of the general formula V, these compounds are generally used in an excess of up to about 20%, preferably in an excess of about 5 to 10%, over the amount theoretically required to achieve the desired degree of conversion. The transesterification takes place in general at about 80° to 160° C. preferably at about 100° to 140° C. If necessary, a solubilizing agent, such as dimethylformamide or N-methylpyrrolidone, can be added in order to increase the solubility of the hydroxyl group containing polymer in the β-ketoester of the general formula V. The reaction equilibrium is shifted in the desired direction by distilling off the lower alcohol formed under a pressure of about 800 to 20 mm Hg, preferably under a pressure of about 400 to 100 mm Hg. When the amount of lower alcohol theoretically expected has been distilled off, the excess β-ketoester of the general formula V and, where appropriate, the added solubilizing agent, are distilled off under a high vacuum. The residue is frequently obtained in the form of a voluminous, solidified foam. It consists of polymers containing side-chain β-groups in high purity, so that these can be used without further purification in the diazo transfer reaction.

The β-ketoesters of the general formula V required for this reaction sequence are commercially available in some cases or can be prepared by methods known from the literature. Their preparation from the corresponding 5-acyl-Meldrum's acids of the general formula IV is particularly preferred. Although this procedure requires an additional reaction step compared with the process variant first described, improved yields and/or purer polymers containing side-chain β-ketoester groups can be obtained in some cases using this variant. The preparation of the polymers containing side-chain β-ketoester groups by reaction of β-ketoesters of the general formula V with hydroxyl group-containing polymers is, however, not preferred.

Both variants are described in detail in EP 378,068 and in the literature references cited above and are therefore not further described here.

In addition, dyes, pigments, plasticizers, wetting agents, levelling agents, and also polyglycols and cellulose ethers, for example, ethylcellulose, can optionally be added to the radiation-sensitive mixtures according to the invention in order to meet specific requirements, such as flexibility, adhesion and gloss.

Preferably, the radiation-sensitive mixture according to the invention is dissolved in a solvent or in a combination of solvents. Solvents particularly suitable for this purpose are ethylene glycol and propylene glycol as well as the monoalkyl and dialkyl ethers derived therefrom, in particular the monomethyl and dimethyl ethers and also the monoethyl and diethyl ethers, esters derived from aliphatic ($C_1$-$C_6$)carboxylic acids and either ($C_1$-$C_8$)alkanols or ($C_1$-$C_8$)alkanediols or ($C_1$-$C_6$)alkoxy-($C_1$-$C_8$)alkanols, for example, ethyl acetate, hydroxyethyl acetate, alkoxyethyl acetate, n-butyl acetate, propylene glycol monoalkyl ether acetate, in particular propylene glycol methyl ether acetate, amyl acetate, ethers, such as tetrahydrofuran and dioxane, ketones, such as methyl ethyl ketone, methyl isobutyl ketone, cyclopentanone and cyclohexanone, N,N-dialkyl-carboxylic acid amides, such as N,N-dimethylformamide and N,N-dimethylacetamide, and also hexamethylphosphonic acid triamide, N-methylpyrrolidin-2-one and butyrolactone, as well as any desired mixtures thereof. Among these solvents, the glycol ethers, aliphatic esters and ketones are particularly preferred.

Ultimately the choice of the solvent or solvent mixture depends on the coating method used, the desired layer thickness and the drying conditions. In addition, the solvents must be chemically inert towards the other layer constituents under the conditions employed.

The mixture dissolved in the solvents generally has a solids content of about 5 to 60% by weight, preferably up to about 50% by weight. The invention also relates to a radiation-sensitive recording material which is essentially composed of a substrate and a radiation-sensitive mixture applied thereto.

Suitable substrates are all materials from which capacitors, semiconductors, multilayer printed circuits or integrated circuits can be composed or produced. Silicon substrates, which can be oxidized by the action of heat, coated with aluminum, or doped, should be mentioned in particular. In addition, all other substrates customary in semiconductor technology are possible, such as silicon nitride, gallium arsenide and indium phosphide. Further suitable substrates are the substrates known from the production of liquid crystal displays, such as, for example, glass and indium-tin oxide, and also metal plates and foils, for example made of aluminum, copper or zinc, bimetal and trimetal foils, also electrically non-conducting films on which metals have been vapor-deposited, and paper. These substrates can be subjected to a heat pretreatment, surface-roughened, slightly etched or, in order to improve desired characteristics, for example, in order to increase the hydrophillic character, pretreated with chemicals.

In order to provide the radiation-sensitive layer with a better cohesion and/or a better adhesion to the substrate surface, this layer can contain an adhesion promoter. In the case of silicon or silicon dioxide substrates, suitable adhesion promoters are those of the aminosilane type, such as 3-aminopropyltriethoxysilane or hexamethyldisilazane.

Suitable supports for the production of photomechanical recording layers, such as printing forms for letterpress printing, planographic printing, screen printing and flexographic printing are, in particular, aluminum plates, which optionally have been anodically oxidized, granulated and/or silicate-treated beforehand. Zinc and steel plates, which optionally have been chromium-plated, can also be used, as well as plastic films and paper.

The recording material according to the invention is exposed imagewise using actinic radiation. Suitable radiation sources are, in particular, metal halide lamps, carbon arc lamps, xenon lamps and mercury vapor lamps. Exposure can also be carried out using high-energy radiation, such as laser or electron radiation or X-rays. However, lamps which are able to emit light having a wavelength of about 190 to 260 nm, i.e., in particular xenon lamps and mercury vapor lamps, are particularly preferred. In addition, laser light sources can also be used, for example Excimer lasers, in particular KrF or ArF lasers, which emit at 248 and 193 nm, respectively. The radiation sources must have an adequate emission in the specified wavelength ranges.

The thickness of the light-sensitive layer depends on the intended use. It is generally between about 0.1 and 100 $\mu$m, preferably between about 0.5 and 10 $\mu$m and particularly preferably about 1.0 $\mu$m.

The invention also relates to a process for the production of a radiation-sensitive recording material. The radiation-sensitive mixture can be applied to the substrate by spraying on, flow-coating, rolling, whirler-coating and dip-coating. The solvent is then removed by evaporation, so that the radiation-sensitive layer remains behind on the surface of the substrate. The removal of the solvent can be promoted by heating the layer to a temperature of up to about 150° C. However, the mixture can also first be applied in the above-mentioned manner to a temporary support, from which it is transferred to the final support material under pressure and at elevated temperature. In principle, all materials which are suitable as support materials can be used as temporary support. The layer is then irradiated imagewise and treated with a developer solution, which dissolves and removes the irradiated regions of the layer, so that an image of the original used for the imagewise exposure remains behind on the substrate surface.

Suitable developers are, in particular, aqueous solutions which contain silicates, metasilicates, hydroxides, hydrogen phosphates and dihydrogen phosphates, carbonates and hydrogen carbonates of alkali metal, alkaline earth metal and/or ammonium ions, and also ammonia and the like. Developers free from metal ions are described in U.S. Pat. No. 4,729,941, EP 62,733, U.S. Pat. No. 4,628,023, U.S. Pat. No. 4,141,733, EP 97,282 and EP 23,758. The content of these substances in the developer solution is generally about 0.1 to 15% by weight, preferably about 0.5 to 5% by weight, based on the weight of the developer solution. Developers free from metal ions are preferably used. If appropriate, small amounts of a wetting agent can be added to the developers, in order to facilitate the removal of the exposed areas in the developer.

The developed layer structures can be post-cured. This is generally effected by heating on a hot plate up to a temperature below the flow point and subsequently exposing the entire surface to UV light from a xenon/mercury vapor lamp (range from 200 to 250 nm). As a result of the post-curing, the image structures are crosslinked, so that they generally exhibit flow resistance up to temperatures in excess of about 200° C. The post-curing can also be effected without a rise in temperature, solely by irradiation with high-energy UV light.

The compounds according to the invention are used in radiation-sensitive mixtures for the production of integrated circuits or of discrete electrical components in lithographic processes, since they have a high photosensitivity, especially upon irradiation with light of a wavelength of between about 190 and 300 nm. Since the mixtures bleach very well on exposure, imaging can be achieved which is distinctly superior to that of the known mixtures with respect to resolution. The recording material produced from the mixture serves as a mask for the subsequent process steps. These include, for example, milling of the layer support, implantation of ions in the layer support or the deposition of metals or other materials on the layer support.

The following examples are intended to illustrate the preparation of the radiation-sensitive polymers according to the invention and their use. However, they are not intended to restrict the invention in any way.

PREPARATION EXAMPLES

Example 1

Linking of 2-diazo-1,3-dicarbonyl side chains to poly (3-methyl-4-hydroxystyrene)

Step 1:

An amount of 3.01 g (11.8 mmol) of 5-(cyclohexylhydroxymethylene)-2,2-dimethyl-[1,3]dioxane-4,6-dione and 8.00 g of a homopolymer of 3-methyl-4-hydroxystyrene having an average molecular weight of 30,000 and a hydroxyl number of 390 are dissolved in 50 ml of acetone and warmed slowly. Above about 60° C. a vigorous evolution of carbon dioxide starts. The solution is then refluxed for an additional hour. The solvent is distilled off in the course of two hours under normal pressure and at a bath temperature of 100° C. Solvent residues and other readily volatile constituents are removed under a high vacuum. During this operation the reaction mixture foams vigorously. After cooling the reaction mixture, a solidified, slightly yellowish and voluminous polymer containing $\beta$-ketoester groups is obtained which can be used without further purification as the starting material for the next step.

Step 2:

The polymer obtained in step 1 is dissolved in 200 ml of acetonitrile and the solution is then cooled to 0° C. An amount of 2.33 g (11.8 mmol) of p-toluenesulfonic acid azide are added to the cooled solution, with stirring, and 1.26 g (12.4 mmol) of triethylamine are then added dropwise at a rate such that the temperature does not rise above 5° C. After stirring for five hours, no further p-toluenesulfonyl azide is detectable in the mixture by thin layer chromatography (silica gel, eluent: ethyl acetate). The solvent is then distilled off under vacuum and the residue is taken up in 100 ml of ethyl acetate. The solution is added dropwise to hexane, whereupon a precipitate forms which is filtered off and dried under vacuum. An amount of 9.9 g (98%) of a slightly yellowish polymer, (containing polymer units of the general formula II), which has a hydroxyl number of 235, are obtained.

IR (KBr): 2.136 cm$^{-1}$ (C=N$_2$)

If appropriate, the product is recrystallized from solvent mixtures composed of ethanol, ethyl acetate, tetrahydrofuran and hexane. In a few cases preparative GPC was used for further purification.

Other polymers which contain side-chain 2-diazo-1,3-dicarbonyl groups can be prepared in an analogous manner. A few selected examples are listed in the table below. The radiation-sensitive polymers according to the invention were characterized by determination of the hydroxyl number, by $^1$H and $^{13}$C high-field nuclear magnetic resonance spectra, and by IR spectra (C=N$_2$ oscillation) and elementary analyses. All experimental values agreed well with the values to be expected theoretically. The yields were good to very good in all cases.

EXAMPLES 2 TO 37

| No. | Polymer Monomer a) | Ratio | Type b) | R | Diazo content c) [%] |
|---|---|---|---|---|---|
| 2 | a | 100 | H | cyclohexyl | 10 |
| 3 | a | 100 | H | 2-phenylethyl | 15 |
| 4 | a | 100 | H | n-butyl | 15 |
| 5 | a:b | 75:25 | B | cyclohexyl | 20 |
| 6 | a:b | 75:25 | C | cyclohexyl | 20 |
| 7 | a:b | 65:35 | C | ethyl | 40 |
| 8 | a:j | 75:25 | C | cyclohexyl | 15 |
| 9 | a:k | 90:10 | B | methyl | 20 |
| 10 | a:k | 90:10 | B | phenoxymethyl | 15 |
| 11 | b | 100 | H | cyclohexyl | 70 |
| 12 | b | 100 | H | cyclohexyl | 85 |
| 13 | b:c | 50:50 | C | cyclohexyl | 15 |
| 14 | b:c | 60:40 | C | cyclohexyl | 50 |
| 15 | b:d | 20:80 | C | methyl | 60 |
| 16 | b:d | 35:65 | C | 3-methoxy-carbonylpropyl | 35 |
| 17 | b:e | 50:50 | C | cyclobutyl | 35 |
| 18 | b:k | 15:85 | B | cyclohexyl | 65 |
| 19 | b:l:o | 30:20:50 | T | benzyl | 40 |
| 20 | b:m:o | 25:25:50 | T | benzyl | 30 |
| 21 | b:n:p | 20:30:50 | T | 2-phenylethyl | 20 |
| 22 | c:k | 80:20 | B | tert.-butyl | 10 |
| 23 | d:r | 70:30 | C | n-octyl | 40 |
| 24 | d:s | 30:70 | C | 2-methoxy-carbonylethyl | 10 |
| 25 | d:t | 50:50 | C | 2,5-dioxahexyl | 40 |
| 26 | f | 100 | H | cyclohexyl | 15 |
| 27 | g | 100 | H | cyclohexyl | 35 |
| 28 | h | 100 | H | methyl | 10 |
| 29 | i | 100 | H | methyl | 5 |
| 30 | q | 100 | H | cyclohexyl | 5 |
| 31 | r | 100 | H | cyclohexyl | 60 |
| 32 | s | 100 | H | cyclohexyl | 15 |
| 33 | s:o | 50:50 | C | i-butyl | 20 |
| 34 | t | 100 | H | cyclohexyl | 20 |
| 35 | t:p | 30:70 | C | n-hexyl | 5 |
| 36 | u | 100 | H | cyclohexyl | 10 |
| 37 | u | 100 | H | i-propyl | 10 |

(a) Monomer constituents (k=polymer): a=4-hydroxy-3-methylstyrene; b=4-hydroxystyrene; c=4-hydroxy-3,5-dimethylstyrene; d=styrene; e=3-ethyl-4-hydroxystyrene; f=4-hydroxy-3-methoxystyrene; g=3-hydroxystyrene; h=4-hydroxy-3-propylstyrene; i=3-butyl-4-hydroxystyrene; j=α-ethyl-4-hydroxystyrene; k=novolak (resin S); l=n-octyl vinyl ether; m=n-octadecyl vinyl ether; n=trimethylvinylsilane; o=N-cyclohexylmaleimide; p=N-phenylmaleimide; q=pyrocatechol monomethacrylate; r=resorcinol monomethacrylate; s=pyrogallol monomethacrylate; t=phloroglucinol monomethacrylate; u=3,4,5-monomethacrylate.

(b) Binder type: B=blend (mixture), C=copolymer, H=homopolymer, T=terpolymer.

(c) Based on the phenolic hydroxyl groups converted in the binder containing polymer units of the general formula I, on which the binder is based (in the case of the binders containing two phenolic hydroxyl groups per polymer unit (with the monomer constituents a, s, t and u), the content relates to the average degree of conversion per hydroxyl group present.

Examples 38 to 45 confirm the suitability of the mixture according to the invention for recording materials in microlithography when using radiation of different energies. The superiority of the mixtures according to the invention over those known from the prior art is confirmed on the basis of Comparison Examples 46 and 47.

USE EXAMPLES

The coating solutions were filtered through filters having a pore diameter of 0.2 μm and spin-coated onto a wafer pretreated with an adhesion promoter (hexamethyldisilazane). The speed of rotation of the spin-coater was chosen so that layer thicknesses of about 1.07 μm were obtained after drying at 90° C. for 1 min on the hot plate.

The recording material was exposed imagewise under an original to the UV radiation from a KrF Excimer laser (248 nm) or a xenon/mercury vapor lamp (260 nm, with interference filter) and then subjected to a post-exposure bake at 70° C. for 1 min on a hot plate. The recording material was developed using a 0.27N aqueous (tetramethyl)ammonium hydroxide solution.

In the following examples parts by weight are abbreviated to pwt.

EXAMPLE 38

A photosensitive recording material was prepared with a coating solution composed of

| | |
|---|---|
| 5.625 pwt | of the radiation-sensitive polymer from Example 1, |
| 1.875 pwt | of p-methoxybenzaldehyde bis(phenoxyethyl)acetal, prepared analogously to Preparation Example 1 of DE 37 30 787, and |
| 0.35 pwt | of the 2,1-diazonaphthoquinone-4-sulfonic acid ester of 2-ethoxyethyl bis-4,4'-(4-hydroxyphenyl)-n-valerate, and |
| 42.5 pwt | of propylene glycol monomethyl ether acetate. |

Developing time: 120 s;
Exposure dose: 48 mJ/cm$^2$ (Excimer laser).

EXAMPLE 39

A photosensitive recording material was prepared with a coating solution composed of

| | |
|---|---|
| 6.0 pwt | of the radiation-sensitive polymer from Example 2, |
| 1.5 pwt | of 3,4-dimethoxybenzaldehyde-bis (phenoxyethyl)acetal, prepared analogously to Preparation Example 1 of DE 37 30 787, |
| 0.5 pwt | of bis(4-tert-butyl-benzenesulfonyl)-diazomethane (see DE 39 30 086), and |

-continued

| | |
|---|---|
| 42.5 pwt | of propylene glycol monomethyl ether acetate. |

Developing time: 12 s
Exposure dose: 38 mJ/cm$^2$: (Excimer laser).

EXAMPLE 40

A wafer coated in accordance with Example 38 was irradiated under an original with UV light from a xenon/mercury vapor lamp with an energy of 50 mJ/cm$^2$.

Developing time: 120 s.

EXAMPLE 41

A photosensitive recording material was prepared with a coating solution composed of

| | |
|---|---|
| 6.5 pwt | of the radiation-sensitive copolymer from Example 13, |
| 3.5 pwt | of benzaldehyde bis(phenoxyethyl)acetal, prepared analogously to Preparation Example 1 of DE 37 30 787, and |
| 1.0 pwt | of bis-(4-tert-butyl-benzenesulfonyl)-diazomethane (DE 39 30 086), and |
| 39.0 pwt | of propylene glycol monomethyl ether acetate. |

Developing time: 60 s;
Exposure dose: 35 mJ/cm$^2$ (Excimer laser).

EXAMPLE 42

A photosensitive recording material was prepared with a coating solution composed of

| | |
|---|---|
| 7.5 pwt | of the radiation-sensitive terpolymer from Example 21, |
| 2.5 pwt | of benzaldehyde bis(phenoxyethyl)acetal, prepared analogously to Preparation Example 1 of DE 37 30 787, and |
| 0.6 pwt | of bis-(benzenesulfonyl)-diazomethane (see DE 39 30 086), and |
| 45.0 pwt | of propylene glycol monomethyl ether acetate. |

Developing time: 100 s;
Exposure dose: 31 mJ/cm$^2$ (xenon/mercury vapor lamp).

EXAMPLE 43

A photosensitive recording material was prepared with a coating solution composed of

| | |
|---|---|
| 8.0 pwt | of the radiation-sensitive homopolymer from Example 30, |
| 2.0 pwt | of 3,4-(methylenedioxy)benzaldehyde bis(phenoxyethyl)acetal, |
| 0.3 pwt | of the 7-methoxynaphthoquinone-2-diazide-4-sulfonic acid ester of 2-ethoxethyl 4,4,-bis-(4-hydroxyphenyl)-n-valerate, and |
| 40.0 pwt | of propylene glycol monomethyl ether acetate. |

Developing time: 90 s;
Exposure dose: 42 mJ/cm$^2$ (xenon/mercury vapor lamp).

EXAMPLE 44

A photosensitive recording material was prepared analogously to Example 39, but using 1.5 pwt of terephthalic dialdehyde tetrakis(phenoxyethyl)acetal instead of 1.5 pwt of 3,4-dimethoxybenzaldehyde bis(phenoxyethyl)acetal as the acid-labile component.

Developing time: 75 s;
Exposure dose: 36 mJ/cm$^2$ (Excimer laser).

EXAMPLE 45

A photosensitive recording material was prepared with a coating solution composed of

| | |
|---|---|
| 6.0 pwt | of the radiation-sensitive copolymer from Example 6, |
| 2.3 pwt | of terephthalic dialdehyde tetrakis-(phenoxyethyl)acetal, |
| 0.55 pwt | of benzenesulfonyl-p-toluoyl-diazomethane (see DE 39 30 086), and |
| 42 pwt | of propylene glycol monomethyl ether acetate. |

Developing time: 85 s;
Exposure dose: 44 mJ/cm$^2$ (Excimer laser).

Evaluation of the Developed Recording Materials

The resist structures obtained according to Examples 38 to 45 are a defect-free image of the mask with steep resist edges. Structures less than or equal to 0.50 μm are reproduced in accurate detail. Examination of the edges of the resist profiles using scanning electron microscopy confirmed that these were aligned virtually vertically to the substrate surface. The bleed into the unexposed resist regions was in all cases less than 20 nm/min and the sensitivity of the resist formulation was in all cases less than or equal to 50 mJ/cm$^2$.

EXAMPLES 46 AND 47 (COMPARISON EXAMPLES).

The coating solution according to Example 38 was modified by replacing the radiation-sensitive binder according to the invention used in that example, with an equal amount of poly(3-methyl-4-hydroxystyrene) [$M_w$ (GPC) 25,400] (Example 46) or poly(4-hydroxystyrene) [$M_w$(GPC)=20,400] (Example 47). Following exposure to radiation having a wavelength of 248 nm and an energy of 38 or 36 mJ/cm$^2$ respectively, and developing, structures were obtained the resolution limit of which was reached at about 1.0 μm lines and spaces (Example 46) or which do not exhibit image differentiation meeting the requirements in practice (Example 47).

What is claimed is:

1. A radiation-sensitive polymer, comprising:
(a) units having side groups of the general formula I

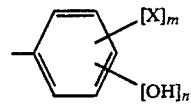

and
(b) units having radiation-sensitive side groups of the general formula II

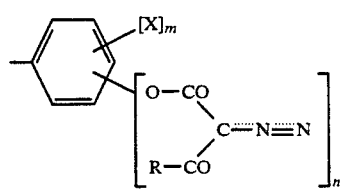

wherein the numerical ratio of units (a) to units (b) is about 98:2 to 0:100, and
wherein
R is an acyclic, isocyclic or heterocyclic radical having 3 to 20 carbon atoms,
X is a $(C_1-C_6)$alkyl, $(C_1-C_6)$alkoxy-$(C_1-C_6)$alkyl, carboxyl, formyl, $(C_1-C_{15})$alkoxycarbonyl, $(C_2-C_5)$alkanoyl or $(C_1-C_6)$alkoxy group or a halogen atom,
m is 0, 1 or 2, it being possible for the radicals X to differ if m=2, and
n is 1 or 2, it being possible for the radicals R to differ if n=2.

2. The radiation-sensitive polymer as claimed in claim 1, wherein the numerical ratio of the units containing groups of the general formula I to those containing groups of the general formula II is from about 95:5 to 40:60.

3. The radiation-sensitive polymer as claimed in claim 1, wherein the numerical ratio of the units containing groups of the general formula I to those containing groups of the general formula II is from about 90:10 to 50:50.

4. The radiation-sensitive polymer as claimed in claim 1, which is derived from a copolymer or terpolymer.

5. A polymer blend which comprises at least one radiation-sensitive polymer as claimed in claim 1.

6. The radiation-sensitive polymer as claimed in claim 1, additionally comprising units derived from monomers selected from the group consisting of styrene, maleimide, vinyl alkyl ether and vinyltrialkylsilane.

7. The radiation-sensitive polymer as claimed in claim 1, wherein the radical R is a straight-chain or branched alkyl radical having 3 to 10 carbon atoms, in which one or more $CH_2$ groups are optionally replaced by —O—, —NH— or —CO—.

8. The radiation-sensitive polymer as claimed in claim 1, wherein the radical R is a straight-chain or branched alkyl radical having 4 to 8 carbon atoms, in which one or more $CH_2$ groups are optionally replaced by —O—, —NH— or —CO—.

9. The radiation-sensitive polymer as claimed in claim 1, wherein the radical R is a cycloalkyl radical having 4 to 10 carbon atoms.

10. The radiation-sensitive polymer as claimed in claim 1, wherein the radical R is a cycloalkyl radical having 4, 5 or 6 carbon atoms.

11. The radiation-sensitive polymer as claimed in claim 1, wherein the radical R is an aralkyl radical having 1 to 11 carbon atoms in the aliphatic part and 6 to 10 carbon atoms in the aromatic part, in which one or more $CH_2$ groups in the aliphatic part are optionally replaced by —O—.

12. The radiation-sensitive polymer as claimed in claim 11, wherein the radical R is an aralkyl radical having 2 to 5 carbon atoms in the aliphatic part and 6 carbon atoms in the aromatic part.

13. The radiation-sensitive polymer as claimed in claim 1, wherein at least one of the units (a) and (b) is derived from hydroxystyrene.

14. The radiation-sensitive polymer as claimed in claim 13, wherein the hydroxystyrene is 4-hydroxystyrene.

15. The radiation-sensitive polymer as claimed in claim 13, wherein the hydroxystyrene has one or two substituents on the aromatic ring, which substituents are selected from the group consisting of methyl, ethyl, propyl, methoxy and ethoxy.

16. The radiation-sensitive polymer as claimed in claim 13, wherein the polymer has an average molecular weight of about 3,000 to 300,000.

17. The radiation-sensitive polymer as claimed in claim 13, wherein the polymer has an average molecular weight of about 10,000 to 35,000.

18. The radiation-sensitive polymer as claimed in claim 1, wherein the units (a) and (b) are derived from at least one monomer selected from the group consisting of monohydroxyphenyl and dihydroxyphenyl methacrylate.

19. The radiation-sensitive polymer as claimed in claim 18, wherein the monohydroxyphenyl or dihydroxyphenyl methacrylate has one or two substituents X on the aromatic ring, which substituents are selected from the group consisting of $(C_1-C_6)$alkyl, $(C_1-C_6)$alkoxy, formyl and $(C_1-C_{15})$alkoxycarbonyl.

20. The radiation-sensitive polymer as claimed in claim 18, wherein the polymer has an average molecular weight of about 1,000 to 100,000.

21. The radiation-sensitive polymer as claimed in claim 18, wherein the polymer has an average molecular weight of about 2,000 to 50,000.

22. The radiation-sensitive polymer as claimed in claim 18, wherein the polymer has an average molecular weight of about 3,000 to 30,000.

23. The radiation-sensitive polymer as claimed in claim 1, additionally comprises units derived from a monomer selected from the group consisting of styrene, optionally N-substituted maleimide, vinyl alkyl ethers and vinyltrialkylsilane.

24. The radiation-sensitive polymer as claimed in claim 1, where X is a $(C_1-C_6)$alkyl, $(C_1-C_6)$alkoxy-$(C_1-C_6)$alkyl, carboxyl, formyl, $(C_1-C_{15})$alkoxycarbonyl, $(C_2-C_5)$alkanoyl or $(C_1-C_6)$alkoxy group.

25. The radiation-sensitive polymer as claimed in claim 24, wherein m is 1 or 2.

26. The radiation-sensitive polymer as claimed in claim 24, wherein R is tert-butyl, n-hexyl, nonyl, octadecyl, 2,5-dioxahexyl, cyclopentyl, cyclohexyl, benzyl, phenethyl, phenoxymethyl or benzyloxymethyl.

27. The radiation-sensitive polymer as claimed in claim 24, wherein the polymer has a low inherent absorption in the wavelength range from about 190 to 300 nm.

28. The radiation-sensitive polymer as claimed in claim 24, wherein the numerical ratio of the units containing groups of the general formula I to those containing groups of the general formula II is from about 95:5 to 40:60.

29. The radiation-sensitive polymer as claimed in claim 24, wherein the numerical ratio of the units containing groups of the general formula I to those containing groups of the general formula II is from about 90:10 to 50:50.

30. The radiation-sensitive polymer as claimed in claim 24, additionally comprising units derived from monomers selected from the group consisting of styrene, maleimide, vinyl alkyl ether and vinyltrialkylsilane.

31. The radiation-sensitive polymer as claimed in claim 24, wherein the radical R is a straight-chain or branched alkyl radical having 4 to 8 carbon atoms, in which one or more $CH_2$ groups are optionally replaced by —O—, —NH— or —CO—.

32. The radiation-sensitive polymer as claimed in claim 24, wherein the radical R is a cycloalkyl radical having 4 to 10 carbon atoms.

33. The radiation-sensitive polymer as claimed in claim 24, wherein the radical R is a cycloalkyl radical having 4, 5 or 6 carbon atoms.

34. The radiation-sensitive polymer as claimed in claim 24, wherein at least one of the units (a) and (b) is derived from hydroxystyrene.

35. The radiation-sensitive polymer as claimed in claim 34, wherein the hydroxystyrene has one or two substituents on the aromatic ring, which substituents are selected from the group consisting of methyl, ethyl, propyl, methoxy and ethoxy.

36. The radiation-sensitive polymer as claimed in claim 1, wherein X is ($C_1$-$C_5$)alkyl or ($C_1$-$C_5$)alkoxy.

37. The radiation-sensitive polymer as claimed in claim 1, wherein m is 1 or 2.

38. The radiation-sensitive polymer as claimed in claim 37, wherein X is methyl, ethyl or n-propyl.

39. The radiation-sensitive polymer as claimed in claim 38, wherein X is methyl.

40. The radiation-sensitive polymer as claimed in claim 39, wherein m is 2.

41. The radiation-sensitive polymer as claimed in claim 1, wherein m is 1.

42. The radiation-sensitive polymer as claimed in claim 1, wherein m is 2.

43. The radiation-sensitive polymer as claimed in claim 1, wherein R is tert-butyl, n-hexyl, nonyl, octadecyl, 2,5-dioxaheyl, cyclopentyl, cyclohexyl, benzyl, phenethyl, phenoxymethyl or benzyloxymethyl.

44. The radiation-sensitive polymer as claimed in claim 1, wherein the polymer has a low inherent absorption in the wavelength range from about 190 to 300 nm.

45. A process for the preparation of the radiation-sensitive polymer as claimed in claim 1, comprising the steps of:
at least partially esterifying a polymer that contains phenolic hydroxyl groups and that is not radiation-sensitive with a compound comprising —CO—$CH_2$—CO—R groups, and then
treating the resultant product with a diazo transfer reagent.

46. The process as claimed in claim 45, wherein the diazo transfer reagent is an alkanesulfonyl azide or benzenesulfonyl azide.

* * * * *